(12) United States Patent
Yates et al.

(10) Patent No.: US 7,053,691 B2
(45) Date of Patent: May 30, 2006

(54) ELECTRICAL CIRCUIT FOR SELECTING A DESIRED POWER SOURCE

(75) Inventors: Kirk Yates, Loomis, CA (US); Andrew M. Cherniski, Rescue, CA (US); Rodrigo Bainotti, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/431,102

(22) Filed: May 6, 2003

(65) Prior Publication Data

US 2004/0222840 A1 Nov. 11, 2004

(51) Int. Cl.
H03K 17/62 (2006.01)
H03K 17/76 (2006.01)
H03K 17/693 (2006.01)
H03K 17/735 (2006.01)

(52) U.S. Cl. .................................. 327/408; 327/543
(58) Field of Classification Search ........ 327/407–408, 327/538, 540, 541, 543
See application file for complete search history.

(56) References Cited

U.S. PATENT DOCUMENTS 5,162,666 A * 11/1992 Tran ........................... 327/408
5,563,546 A * 10/1996 Tsukada ...................... 327/408
6,566,935 B1 * 5/2003 Renous ....................... 327/408

FOREIGN PATENT DOCUMENTS

| EP | 0175099 A | 7/1985 |
| GB | 1299633 A | 3/1970 |
| GB | 2311179 A | 9/1997 |
| JP | 10135810 A * | 5/1998 |

* cited by examiner

Primary Examiner—Quan Tra
(74) Attorney, Agent, or Firm—Tuan V. Ngo

(57) ABSTRACT

A circuit that allows selection of a power source among a plurality of power sources is disclosed. In an embodiment, either one or both voltage sources $V_{aux}$ and $V_{app}$ may be available in a system. If both sources are available, then the circuit enables the system to use source $V_{aux}$. However, if only one of the two sources is available, then the circuit enables the system to use that available source.

17 Claims, 6 Drawing Sheets

| $V_{aux}$ | $V_{app}$ | $V_{out}$ (V) | Source |
|---|---|---|---|
| ON | ON | 3.30 | $V_{aux}$ |
| ON | OFF | 3.30 | $V_{aux}$ |
| OFF | ON | 3.30 | $V_{app}$ |
| OFF | OFF | 0.00 | N/A |

ELECTRICAL CIRCUIT FOR SELECTING A DESIRED POWER SOURCE

FIELD OF THE INVENTION

The present invention relates generally to electrical circuits and, more specifically, to a circuit that enables selection of a desired power source.

BACKGROUND OF THE INVENTION

In various applications, there is a need to select a desired power source, e.g., a voltage source, among various voltage sources. Many approaches use expensive, larger, and specialized chips that would monitor and control multiple voltage sources of different values. These chips also need additional support components such as a separate source to power up the chips, and may cause a center point of failure within the circuit using the chips because if a chip or the source supporting the chip does not function properly, then it renders the whole circuit inoperable. Therefore, it is desirable that mechanisms be provided to solve the above deficiencies and related problems.

SUMMARY OF THE INVENTION

The present invention is related to a circuit that allows selection of a power source such as a voltage source, a current source, etc., among a plurality of power sources. In an embodiment, either one or both voltage sources $V_{aux}$ and $V_{app}$ may be available in a system. If both sources are available, then the circuit enables the system to use source $V_{aux}$. However, if only one of the two sources is available, then the circuit enables the system to use that available source.

BRIEF DESCRIPTION OF THE DRAWINGS

The present invention is illustrated by way of example, and not by way of limitation, in the figures of the accompanying drawings in which like reference numerals refer to similar elements and in which:

FIG. 2 shows a table summarizing the operation of the circuit in FIG. 1;

DETAILED DESCRIPTION OF THE PREFERRED EMBODIMENT

In the following description, for the purposes of explanation, numerous specific details are set forth in order to provide a thorough understanding of the present invention. However, it will be apparent to one skilled in the art that the invention may be practiced without these specific details. In other instances, well-known structures and devices are shown in block diagram form in order to avoid obscuring the invention.

Field-Effect Transistors

Embodiments of the invention use Field Effect Transistors (FETs) that operate differently, depending on whether the transistor is a P-channel or an N-channel. A FET having a P-channel or an N-channel is commonly referred to as a PFET or an NFET, respectively. For illustration purposes, the voltage at the gate of a FET with respect to its source is referred to as voltage $V_{GS}$, and the voltage at the drain of the FET with respect to its source is referred to as voltage $V_{DS}$. The threshold voltage to turn on a FET is referred to as voltage $V_T$, which is negative for a PFET and positive for an NFET. When a FET is turned on, the amount of current flows between the source and the drain depends on the relationship between $|V_{DS}|$ and $|V_{GS}-V_T|$, and the current flows from the drain to the source in an NFET, and from the source to the drain in a PFET. Those skilled in the art will recognize that the direction of the current flows varies depending on points of references, whether the current is represented by protons, electrons, etc.

Exemplary family members of FETs include Junction Field-Effect Transistors (JFETs) and Insulated-Gate Field-Effect Transistors (IGFET), which are commonly referred to as Metal-Oxide-Semiconductor FET (MOSFET). The invention is not limited to a particular type of FET, and embodiments of the invention may use equivalences of FETs.

Embodiments of the Invention, Positive Voltage Sources

Figure 1:
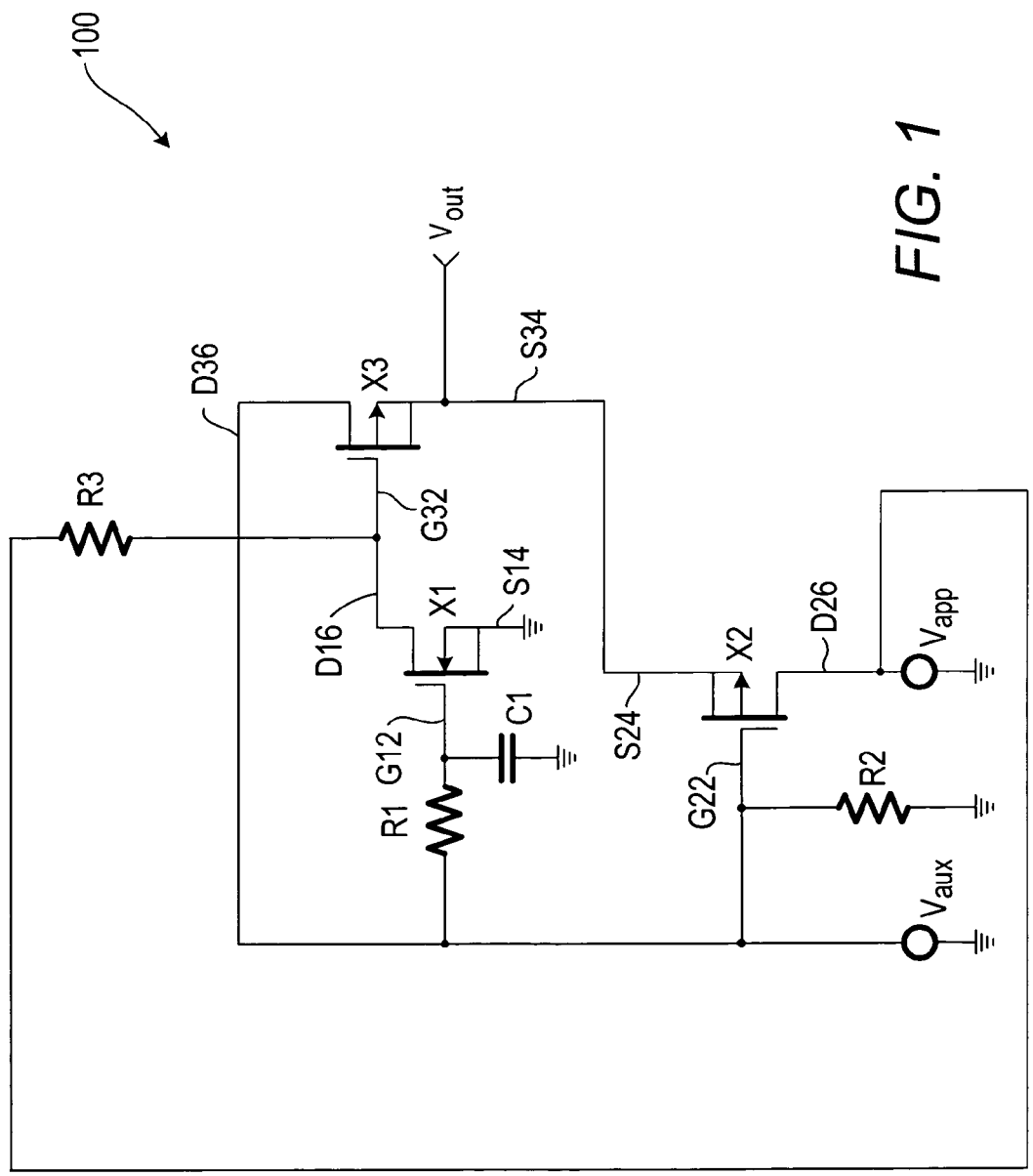
FIG. 1 shows a circuit upon which embodiments of the invention may be implemented.

FIG. 1 shows a circuit 100 upon which embodiments of the invention may be implemented. Transistor X1 is an NFET, while transistors X2 and X3 are PFETs. Depending on various situations, circuit 100 selects either power or voltage source $V_{aux}$ or $V_{app}$ to be available as voltage $V_{out}$. In an embodiment, sources $V_{aux}$ and $V_{app}$ are of the same positive voltage level of 3.3V, voltage threshold $V_T$ is -0.8V for PFET X2 and X3 and 0.8V for NFET X1. That is, if $V_{GS}$ for PFETs X2 and X3 are less than or equal to -0.8V, then PFETs X2 and X3 are on, and are off otherwise. Conversely, if $V_{GS}$ for NFET X1 is greater than or equal to 0.8V, then NFET X1 is on, and is off otherwise.

However, the invention is not limited to a particular level of threshold $V_T$, source $V_{aux}$, or source $V_{app}$. Various levels working with transistors are within the scope of embodiments of the invention. For example, threshold $V_T$ may be at 0.65V, 0.7V, -0.65V, -0.7V, etc., and $V_{aux}$ and/or $V_{app}$ may range from -12V to +12V, etc. Nevertheless, when sources $V_{aux}$ and $V_{app}$ are negative, then PFETs X2 and X3 are replaced by NFETs, and NFET X1 is replaced by a PFET. Further, a current source and/or a device operating with a voltage source that can power on/off the transistors are within the scope of embodiments of the invention.

When Both Sources $V_{AUX}$ and $V_{APP}$ are Available

When both sources $V_{aux}$ and $V_{app}$ are available, the voltage at gate G22 and at source S24 of PFET X2 is 3.3V ($V_{aux}$) and 3.3V ($V_{out}$), respectively. Consequently, $V_{GS}$ of X2 is at 0V, which is greater than $V_T$ of X2 at -0.8V, and PFET X2 is therefore off.

At the same time, voltage $V_{aux}$ at gate G22 passes through resistor R1 and results in about 3.3V at gate G12 of NFET X1. As a result, $V_{GS}$ of X1 is at 3.3V, which is greater than $V_T$ of X1 at 0.8V, and NFET X1 is therefore on. Because NFET X1 is on, the voltage at drain D16 of NFET X1 is pulled to the voltage at its source S14, which is ground or 0V. Further, NFET X1 being on serves as a current path for the current provided by voltage source V$_{app}$. That is, NFET X1 allows this current to flow through drain D16 and source S14 to ground.

Additionally, the current at gate G22 of PFET X2 flows through drain D36 and source S34 of PFET X3 to result in a voltage 3.3V at source S34 of PEET X3. Because voltage at gate G32 and at source S34 of X3 is at 0V and 3.3V, respectively, V$_{GS}$ of X3 is −3.3V, which is less than V$_T$ of PFET X3 at −0.8V, and which confirms that PFET X3 is on, enabling current to flow between drain D36 and source S34. Voltage V$_{out}$ is in fact voltage at source S34, which, as discussed, is provided by voltage V$_{aux}$.

When Only Source V$_{AUX}$ is Available

When only source V$_{aux}$ is available, voltage at gate G22 is at 3.3V and at drain D26 is 0V, resulting in 0V for V$_{GS}$ of PFET X2, which turns PFET X2 off because turning on PFET X2 requires a V$_{GS}$ of less than or equal to −0.8V. Similar to the above situation when PFET X2 is off, voltage V$_{aux}$ at gate G22 passes through resistor R1 and results in about 3.3V at gate G12 of NFET X1. As a result, V$_{GS}$ of X1 is at 3.3V, which is greater than V$_T$ of X1 at 0.8V, and NFET X1 is therefore on. Because NFET X1 is on, the voltage at drain D16 of NFET X1 is pulled to the voltage at its source S14, which is ground or 0V. Further, the current at gate G22 of PFET X2 flows through drain D36 and source S34 of PFET X3 to result in a voltage 3.3V at source S34 and drain D36 of PFET X3. Because voltage at gate G32 and at source S34 of X3 is at 0V and 3.3V, respectively, V$_{GS}$ of X3 is −3.3V, which is less than V$_T$ at −0.8V of PFET X3, and which confirms that PFET X3 is on, enabling current to flow between drain D36 and source S34. Voltage V$_{out}$ is in fact voltage at source S34, which, as discussed, is provided by voltage V$_{aux}$.

When Only Source V$_{APP}$ is Available

When only source V$_{app}$ is available, source V$_{aux}$ is not available, resulting in 0V at gate G22, and 3.3V at drain D26. Therefore V$_{GS}$ of PFET X2 is −3.3V, which turns it on and thus allows current to flow between drain D26 and source S24. Voltage at source S24 is thus pulled to voltage at drain D26, i.e., voltage of V$_{app}$, and is thus at 3.3V. In fact, voltage at source S24 is the same as at source S34 and is also V$_{out}$.

Voltage at gate G22 at 0V results in 0V at gate G12, and also results in 0V for V$_{GS}$ of NFET X1, which turns NFET X1 off.

Voltage V$_{app}$ of 3.3V at drain D26 results in 3.3V at drain D16, which is the same as at gate G32. Because voltage at gate G32 and at source S34 is both at 3.3V, resulting in 0V for V$_{GS}$ of X3, which turns X3 off.

The above analysis is consistent with the fact that voltage V$_{out}$ is at 3.3 V and is provided by source V$_{app}$.

Summary of Operation of Circuit 100

FIG. 2 shows a table 200 summarizing the operation of circuit 100. Line 210 indicates that when both V$_{aux}$ and V$_{app}$ are available, V$_{out}$ is at 3.3V and is provided by source V$_{aux}$. Line 220 indicates that if only V$_{aux}$ is available, then V$_{out}$ is at 3.3V and is provided by source V$_{aux}$. Line 230 indicates that if only V$_{app}$ is available, then V$_{out}$ is at 3.3V and is provided by source V$_{app}$. Line 240 indicates that if both V$_{aux}$ and V$_{app}$ are not available, then V$_{out}$ is at 0V.

Resistors and Capacitors

Resistor R1, together with capacitor C1, constitutes an RC circuit that eliminates conflict or race conditions between sources V$_{aux}$ and V$_{app}$ when both sources are available. This RC circuit controls the rate of time it takes for the gate of PFET X1 to be charged on. In the embodiment of FIG. 1, the selected value for this RC circuit slows down the activation of the gate of PFET X1 by 1/10*6 second. As a result, if V$_{app}$ arrives at the RC circuit before V$_{aux}$ does, then the RC circuit allows time to shutdown voltage V$_{app}$ and thus allows V$_{aux}$, instead of V$_{app}$, to be selected as V$_{out}$.

Resistor R2 provides a path for current to sink from gate G22. Resistor R3 limits the amount of current being sunk through PFET X1 when X1 is on. In the FIG. 1 embodiment, the current limit is 0.67A (=3.3V/5K) or 2.1 mW.

Resistors R1, R2, and R3 are at 20K OHM, 5K OHM, and 5K OHM, respectively, and capacitor C1 is at 0.1 micro Fahrad. Selecting a value for resistors R1, R2, and R3 is based on the resistor's power dissipation, the ability of the source to provide for the current drawn by the resistors, etc. Those skilled in the art will recognize that the lower value or the lower resistance of a resistor results in increased power loss through the resistor. As indicated above resistor R3 sinks 2.1 mW, and a resistor rated to 62 mW, which is much higher than 2.1 mW, was selected for R3.

Additional Applications for Circuit 100

Embodiments of the invention are applicable when one or a plurality of circuits 100 is added to another circuit 100 so that the resulting circuit may select a desired voltage source from a plurality of voltage sources. There are various ways to add a circuit 100 to an existing circuit having multiple circuits 100. Embodiments of the invention are applicable in those various ways wherein a circuit 100 receives two voltage sources as direct inputs. For example, the output source of a first circuit 100 and another source may be direct inputs to a second circuit 100. Alternatively, two output sources of two circuits 100 are direct inputs to a third circuit 100, etc. The invention is not limited to how a circuit 100 is added to another circuit having circuits 100. In FIG. 1, sources V$_{aux}$ and V$_{app}$ are direct inputs to circuit 100.

Figure 3:
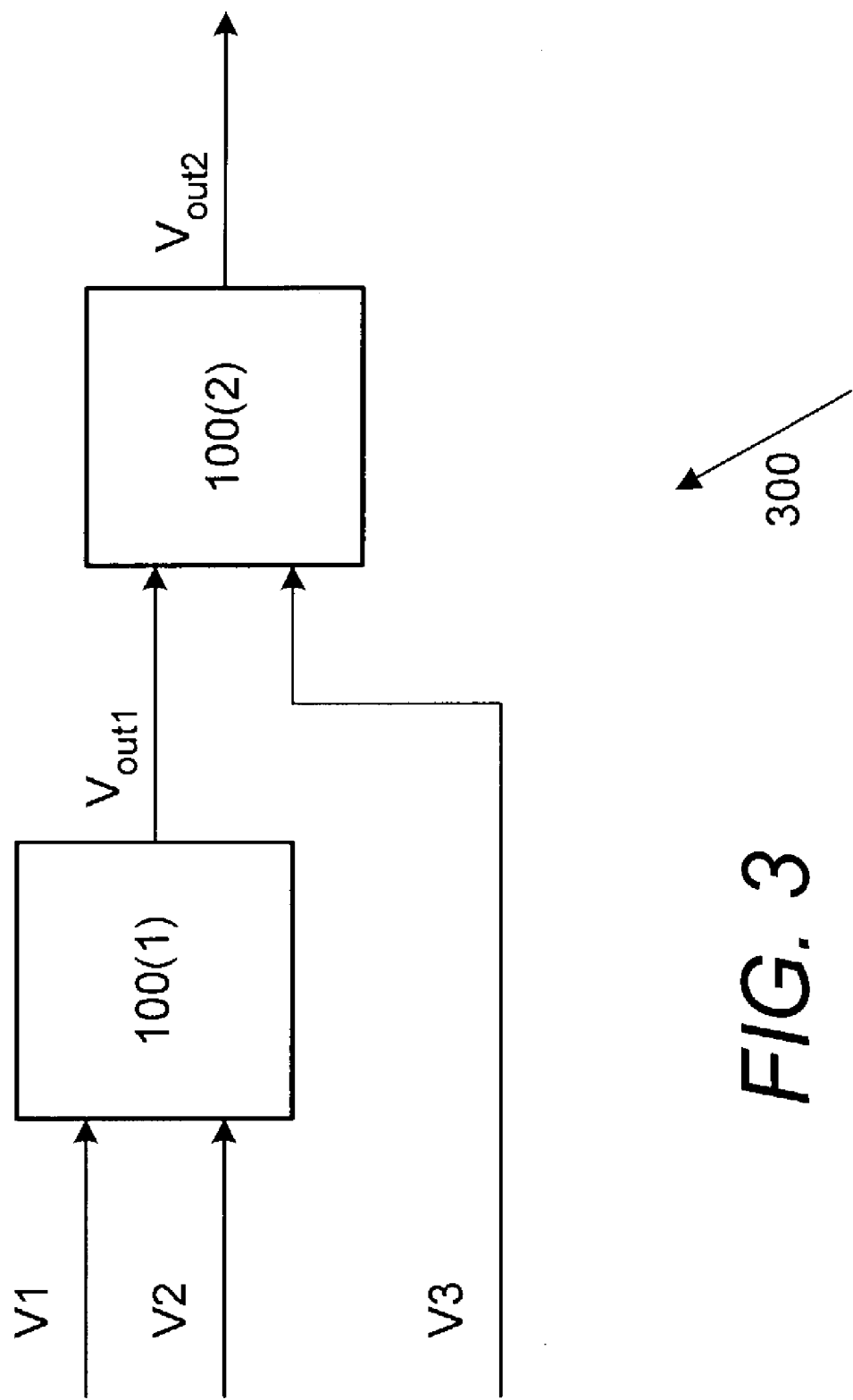
FIG. 3 shows a first circuit using a plurality of the circuit in FIG. 1, in accordance with an embodiment.

FIG. 3 shows a first circuit 300 using circuits 100(1) and 100(2), in accordance with an embodiment. Circuit 100(1) and circuit 100(2) operate in accordance with the described-above explanation. That is, circuit 100(1) selects appropriate voltage sources V1 and V2 to provide voltage V$_{out1}$. Circuit 100(2) selects appropriate voltage sources V$_{out1}$ and V3 to provide voltage V$_{out2}$.

Figure 4:
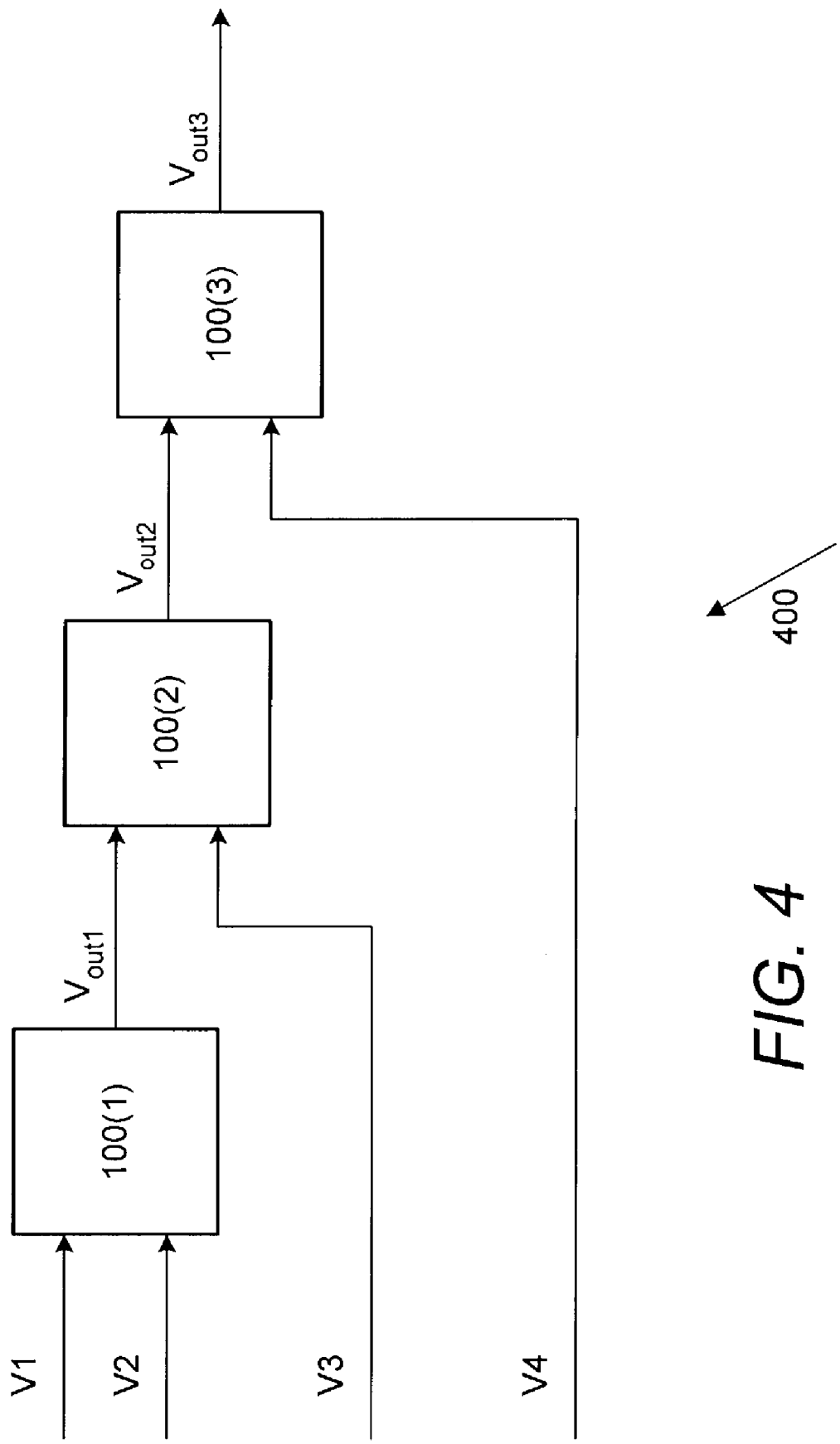
FIG. 4 shows a second circuit using a plurality of the circuit in FIG. 1, in accordance with an embodiment.

FIG. 4 shows a second circuit 400 using circuits 100, in accordance with an embodiment. Circuit 400 is similar to circuit 300 with the addition of circuit 100(3) that appropriately selects voltage sources V$_{out2}$ and V4 to provide voltage V$_{out3}$.

Figure 5:
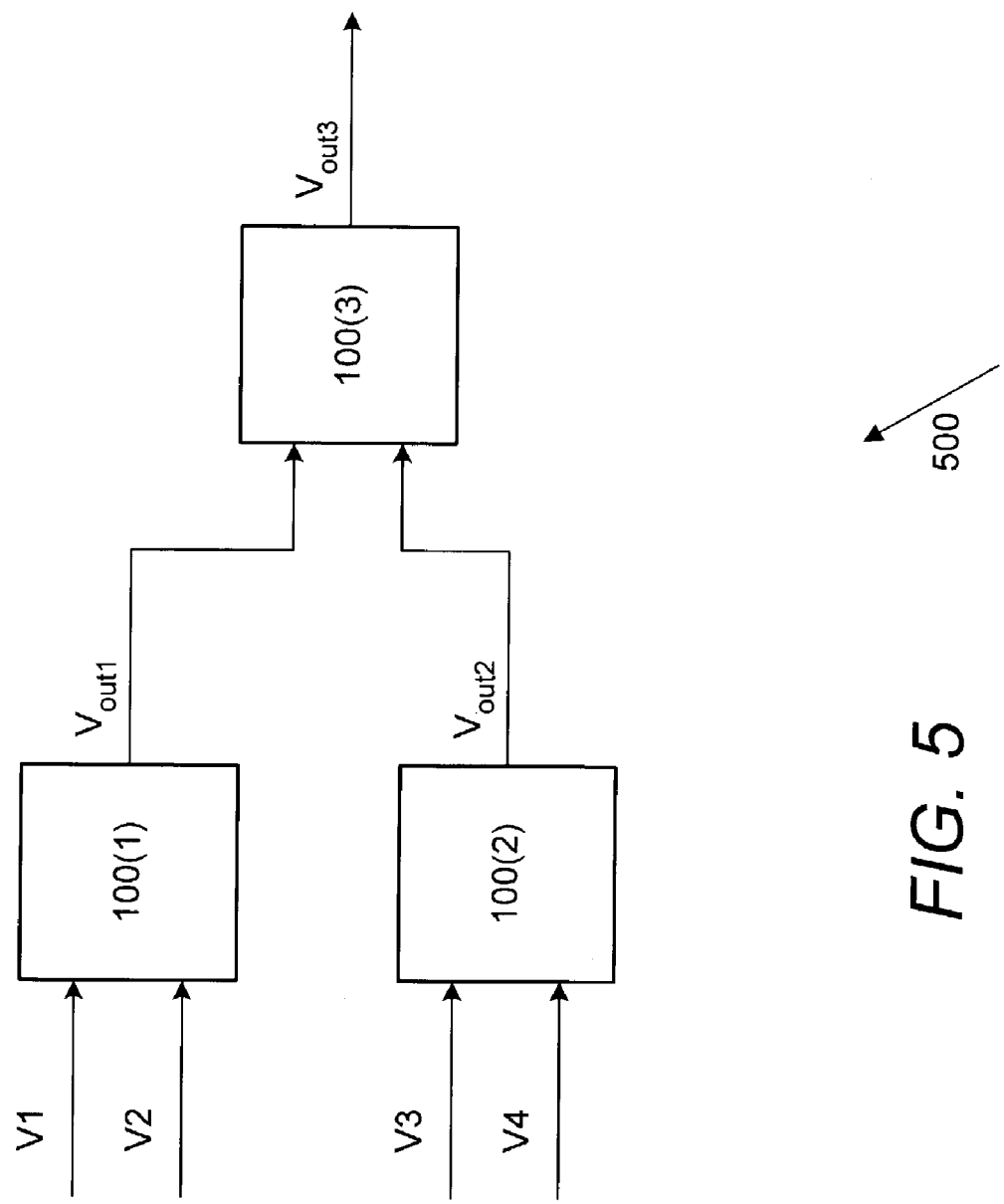
FIG. 5 shows a third circuit using a plurality of the circuit in FIG. 1, in accordance with an embodiment.

FIG. 5 shows a third circuit 500 using circuits 100, in accordance with an embodiment. Circuit 500 includes the same number of circuits 100(1), 100(2), and 100(3) as in circuit 400, but have different arrangements. Circuit 100(1) selects voltage sources V1 and V2 to provide voltage V$_{out1}$. Circuit 100(2) selects voltage sources V3 and V4 to provide voltage V$_{out2}$, and circuit 100(3) selects voltage sources V$_{out1}$ and V$_{out2}$ to provide voltage V$_{out3}$.

Using the above example, one or a combination of one or a plurality of circuits 100, 300, 400, and 500 may be used to build a circuit that can select a desired voltage source among various sources.

Embodiments of the Invention, Negative Voltage Sources

Figure 6:
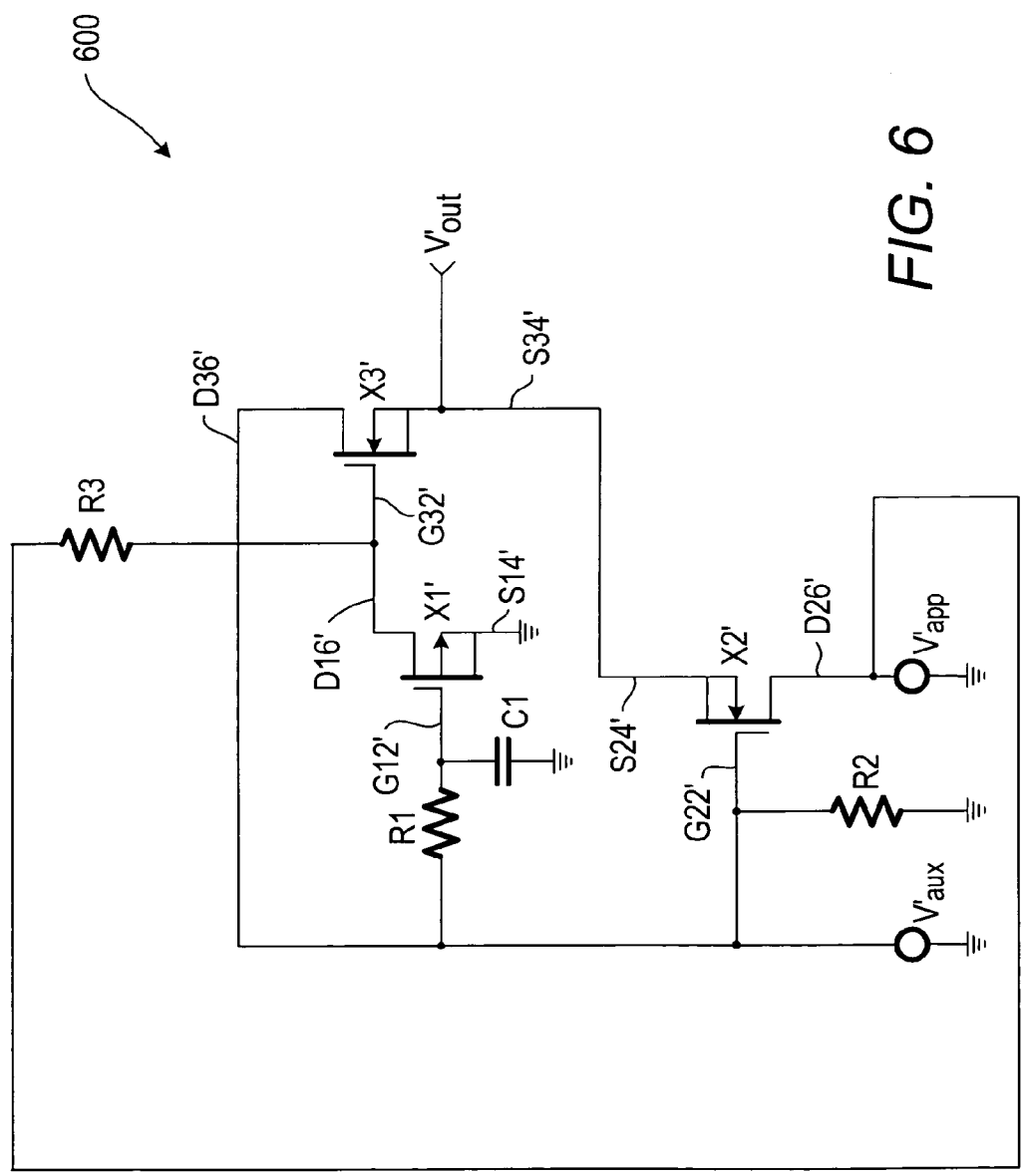
FIG. 6 shows a variation of the circuit in FIG. 1.

In the embodiment of FIG. 1, voltage sources $V_{aux}$ and $V_{app}$ are positive. However, embodiments of the invention are also applicable when $V_{aux}$ and $V_{app}$ are negative. In such a case, PFETs X2 and X3 are replaced by NFETs, e.g., X2' and X3', respectively, and NFET X1 is replaced by a PFET, e.g., X1'. For illustration purposes, negative input voltage sources $V_{aux}$ and $V_{app}$ are referred to as $V'_{aux}$ and $V'_{app}$, and negative output $V_{out}$ is referred to as $V'_{out}$. FIG. 6 shows a circuit 600 using negative input voltage sources as described, in accordance with an embodiment.

When Both Input Sources $V'_{AUX}$ and $V'_{APP}$ are Available

When both sources $V'_{aux}$ and $V'_{app}$ are available, the voltage at gate G22' and at source S24' of NFET X2' is −3.3V ($V_{aux}$) and −3.3V ($V_{out}$), respectively. Consequently, $V_{GS}$ of X2' is at 0V, which is less than $V_T$ of X2' at 0.8V, and NFET X2' is therefore off.

At the same time, voltage $V'_{aux}$ at gate G22' passes through resistor R1 and results in about −3.3V at gate G12' of PFET X1'. As a result, $V_{GS}$ of X1' is at −3.3V, which is lesser than $V_T$ of X1' at −0.8V, and PFET X1' is therefore on. Because PFET X1' is on, the voltage at drain D16' of PFET X1' is pulled to the voltage at its source S14', which is ground or 0V. Further, PFET X1' being on serves as a current path for the current provided by voltage source $V'_{app}$. That is, PFET X1' allows this current to flow between drain D16', source S14', and ground.

Additionally, the current at gate G22' of NFET X2' flows through drain D36' and source S34' of NFET X3' to result in a voltage −3.3V at source S34' of NFET X3'. Because voltage at gate G32' and at source S34' of X3 is at 0V and −3.3V, respectively, $V_{GS}$ of X3' is 3.3V, which is greater than $V_T$ of NFET X3' at 0.8V, and which confirms that NFET X3' is on, enabling current to flow between drain D36' and source S34'. Voltage $V'_{out}$ is in fact voltage at source S34', which, as discussed, is provided by voltage $V'_{aux}$.

When Only Source $V'_{AUX}$ is Available

When only source $V'_{aux}$ is available, voltage at gate G22' is at −3.3V and at drain D26' is 0V, resulting in 0V for $V_{GS}$ of NFET X2', which turns NFET X2' off because turning on NFET X2' requires a $V_{GS}$ of more than or equal to 0.8V. Similar to the above situation when NFET X2' is off, voltage $V'_{aux}$ at gate G22' passes through resistor R1 and results in about −3.3V at gate G12' of PFET X1'. As a result, $V_{GS}$ of X1' is at −3.3V, which is less than $V_T$ of X1' at −0.8V, and PFET X1' is therefore on. Because PFET X1' is on, the voltage at drain D16' of PFET X1' is pulled to the voltage at its source S14', which is ground or 0V. Further, the current at gate G22' of NFET X2' flows through drain D36' and source S34' of NFET X3' to result in a voltage −3.3V at source S34' and drain D36' of NFET X3'. Because voltage at gate G32' and at source S34' of X3' is at 0V and −3.3V, respectively, $V_{GS}$ of X3' is 3.3V, which is greater than $V_T$ at 0.8V of NFET X3', and which confirms that NFET X3' is on, enabling current to flow between drain D36' and source S34'. Voltage $V'_{out}$ is in fact voltage at source S34', which, as discussed, is provided by voltage $V'_{aux}$.

When Only Source $V'_{APP}$ is Available

When only source $V'_{app}$ is available, source $V'_{aux}$ is not available, resulting in 0V at gate G22', and −3.3V at drain S36'. Therefore $V_{GS}$ of NFET X2' is 3.3V, which turns it on and thus allows current to flow between drain D26' and source S24'. Voltage at source S24' is thus pulled to voltage at drain D26', i.e., voltage Of $V'_{app}$, and is thus at −3.3V. In fact, voltage at source S24' is the same as at source D34' and is also $V'_{out}$.

Voltage at gate G22' at 0V results in 0V at gate G12', and also results in 0V for $V_{GS}$ of PFET X1', which turns PFET X1' off.

Voltage $V'_{app}$ of −3.3V at drain D26' results in −3.3V at drain D16', which is the same as at gate G32'. Because voltage at gate G32' and at source S34' is both at −3.3V, resulting in 0V for $V_{GS}$ of X3', which turns X3' off.

The above analysis is consistent with the fact that voltage $V'_{out}$ is at −3.3V and is provided by source $V'_{app}$.

Similar to positive input voltage sources, various combinations of circuits 600 that receive negative input voltage sources may be built to create a circuit that selects a negative input source among many negative sources.

In the foregoing specification, the invention has been described with reference to specific embodiments thereof. However, it will be evident that various modifications and changes may be made without departing from the broader spirit and scope of the invention. For example, resistive elements and capacitive elements may work in place of resistors and capacitors, respectively; switches may work in place of transistors, etc. Accordingly, the specification and drawings are to be regarded as illustrative rather than as restrictive.

What is claimed is:

1. A circuit comprising:
   a first transistor, a second transistor, a third transistor; and
   a first power source, a second power source, and an output source;
   wherein
     if both the first power source and the second power source are available or if the first power source is available but the second power source is not available, then the circuit selects the first power source as the output source; the first transistor and the third transistor are on; and the second transistor is off;
     else if the first power source is not available and the second power source is available, then the circuit selects the second power source as the output source; the first transistor and the third transistor are off; and the second transistor is on;
   a gate of the second transistor is directly coupled to the first power source; and a delay circuit for eliminating the race condition between the first power source and the second power source, when both the first power source and the second power source are available; the delay circuit being coupled between the first power source and a gate of the first transistor.

2. The circuit of claim 1 wherein the delay circuit comprises a capacitive element and a first resistive element; a first end of the first resistive element being coupled to a gate of the first transistor and a first end of the capacitive element; a second end of the capacitive element being coupled to ground.

3. The circuit of claim 2 further comprising a second resistive element; a first end of the second resistive element being coupled to the gate of the second transistor, the first power source, a second end of the first resistive element, and a drain of the third transistor; a second end of the second resistive element being coupled to ground.

4. The circuit of claim 3 further comprising a third resistive element; a first end of the third resistive element being coupled to a gate of the third transistor and a second end of the third resistive element being coupled to a drain of the second transistor and the second power source.

5. The circuit of claim 1 further comprising a first resistive element for providing a path for current sink through the first resistive element at the gate of the second transistor, and a second resistive element for limiting the current sunk by the first transistor.

6. The circuit of claim 1 wherein:
the first power source and the second power source operate with positive potentials;
the first transistor is N-channel; and
the second transistor and the third transistor are P-channel.

7. The circuit of claim 1 wherein:
the first power source and the second power source operate with negative potentials;
the first transistor is P-channel; and
the second transistor and the third transistor are N-channel.

8. The circuit of claim 1 wherein one or both of the first power source and the second power source is selected from a group consisting of a voltage source and a current source.

9. A circuit comprising:
a first transistor, a second transistor, a third transistor;
a first resistive element, a second resistive element, a third resistive element;
a capacitive element; and
a first power source and a second power source;
wherein:
a gate of the first transistor is coupled to a first end of the first resistive element and a first end of the capacitive element;
a drain of the first transistor is coupled to a first end of the third resistive element and a gate of the third transistor;
a gate of the second transistor is directly coupled to a first end of the second resistive element, the first power source, a second end of the first resistive element, and a drain of the third transistor;
a drain of the second transistor is coupled to the second power source and a second end of the third resistive element; and
a source of the second transistor is coupled to a source of the third transistor and an output source; and 10. The circuit of claim 9 wherein:
the first power source and the second power source operate with positive potentials;
the first transistor is N-channel;
the second transistor and the third transistor are P-channel.

11. The circuit of claim 9 wherein:
the first power source and the second power source operate with negative potentials;
the first transistor is P-channel; and
the second transistor and the third transistor are N-channel.

12. The circuit of claim 1 wherein:
the first power source is further coupled to a drain of the third transistor;
the second power source is coupled to a drain of the second transistor; and
the output source is coupled to a source of the second transistor and a source of the third transistor.

13. The circuit of claim 12 wherein:
the first power source is further coupled to a first end of a resistor; and
a second end of the resistor is coupled to a gate of the first transistor and a capacitor.

14. The circuit of claim 12 wherein:
the second power source is further coupled to a first end of a resistor; and
a second end of the resistor is coupled to a gate of the third transistor.

15. The circuit of claim 1 wherein a drain of the first transistor is coupled to a gate of the third transistor.

16. The circuit of claim 15 wherein a gate of the first transistor, via an RC circuit, is coupled to the gate of the second transistor and the second power source.

17. The circuit of claim 9 wherein:
a second end of the capacitive element is coupled to ground;
a source of the first transistor is coupled to ground; and
a second end of the second resistive element is coupled to ground.

* * * * *

UNITED STATES PATENT AND TRADEMARK OFFICE
CERTIFICATE OF CORRECTION

| | | |
|---|---|---|
| PATENT NO. | : 7,053,691 B2 | Page 1 of 1 |
| APPLICATION NO. | : 10/431102 | |
| DATED | : May 30, 2006 | |
| INVENTOR(S) | : Kirk Yates et al. | |

It is certified that error appears in the above-identified patent and that said Letters Patent is hereby corrected as shown below:

In column 3, line 8, delete "PEET" and insert -- PFET --, therefor.

In column 8, line 5, in Claim 9, delete "source; and" and insert -- source. --, therefor.

Signed and Sealed this

Fifth Day of January, 2010

David J. Kappos
*Director of the United States Patent and Trademark Office*